United States Patent
Min et al.

(10) Patent No.: US 8,564,009 B2
(45) Date of Patent: Oct. 22, 2013

(54) VERTICAL LIGHT EMITTING DEVICE

(75) Inventors: Bok-ki Min, Suwon-si (KR); Young-soo Park, Yongin-si (KR); Su-hee Chae, Suwon-si (KR); Jun-youn Kim, Hwaseong-si (KR); Hyun-gi Hong, Suwon-si (KR); Young-jo Tak, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 32 days.

(21) Appl. No.: 13/188,791

(22) Filed: Jul. 22, 2011

(65) Prior Publication Data

US 2012/0175662 A1  Jul. 12, 2012

(30) Foreign Application Priority Data

Jan. 11, 2011 (KR) .......... 10-2011-0002870

(51) Int. Cl.
*H01L 33/42* (2010.01)

(52) U.S. Cl.
USPC .......... 257/99; 257/E33.064; 977/742

(58) Field of Classification Search
USPC ............................................. 257/99; 977/742
IPC ........................................ H01L 33/00,21/306
See application file for complete search history.

(56) References Cited

U.S. PATENT DOCUMENTS

| | | |
|---|---|---|
| 6,518,598 B1 | 2/2003 | Chen |
| 2002/0195609 A1* | 12/2002 | Yoshitake et al. ............... 257/81 |
| 2011/0079813 A1* | 4/2011 | Yeol et al. ........................ 257/98 |

FOREIGN PATENT DOCUMENTS

| | | |
|---|---|---|
| JP | 2004165654 A | 6/2004 |
| JP | 2007251130 A | 9/2007 |
| KR | 100452751 B1 | 10/2004 |
| KR | 1020060066871 | 6/2006 |
| KR | 1020060125253 | 12/2006 |
| KR | 1020070041203 | 4/2007 |

* cited by examiner

*Primary Examiner* — Jarrett Stark
*Assistant Examiner* — Lawrence Tynes, Jr.
(74) *Attorney, Agent, or Firm* — Harness, Dickey & Pierce, P.L.C.

(57) ABSTRACT

According to an example embodiment, a vertical light emitting device (LED) includes a semiconductor layer including an active layer configured to emitting light, a first electrode on a first side of the semiconductor layer, and a second electrode on a second side of the semiconductor layer opposite to the first electrode. At least one of the first and second electrodes includes a metal electrode pattern and a transparent electrode pattern. The transparent electrode pattern is in a region between segment electrodes of the metal electrode pattern. The transparent electrode pattern is electrically connected to the metal electrode pattern.

14 Claims, 6 Drawing Sheets

VERTICAL LIGHT EMITTING DEVICE

CROSS-REFERENCE TO RELATED APPLICATIONS

This application claims priority under 35 U.S.C. §119 to Korean Patent Application No. 10-2011-0002870, filed on Jan. 11, 2011, in the Korean Intellectual Property Office, the disclosure of which is incorporated herein in its entirety by reference.

BACKGROUND

1. Field

Example embodiments relate to a vertical light emitting device.

2. Description of the Related Art

As semiconductor light emitting devices (LED), especially, Gallium Nitride (GaN)-based light emitting devices, have received considerable attention as being highly efficient, environment-friendly light sources. They are being used in a wider range of applications such as back light units for various types of displays, LCDs for mobile phones, LCD TVs, and monitors, light sources for automobiles, and light sources for general illumination. With a broader use of GaN-based LEDs, high output, large area LEDs are gaining popularity, and vertical structure LEDs have emerged as a suitable structure for high power and large area LEDs.

Since large-area vertical GaN-based LEDs with high output power have a large chip area and are driven by high current, current spreading is very important in LED design in order to spread current evenly across the entire chip area in an LED. Non-uniform current spreading may cause current crowding, i.e., current concentration in local regions of an LED chip. The current crowding effect may increase current density at the local regions of LED chip, thereby degrading the efficiency of the LED while increasing a driving voltage. The current crowding is also responsible for local overheating and a short LED lifetime, thereby degrading device reliability. Driving current as well as chip area has been increasing as the industry pushes for higher output power LEDs. Accordingly, there is an increasing need for development of current spreading design and technology that can mitigate current crowding problems.

SUMMARY

According to an example embodiment, a vertical light emitting device (LED), includes a semiconductor layer, a first electrode and a second electrode. The semiconductor layer includes an active layer configured to emitting light. The first electrode is on a first side of the semiconductor layer. The second electrode is on a second side of the semiconductor layer opposite to the first electrode. At least one of the first and second electrodes includes a metal electrode pattern and a transparent electrode pattern. The transparent electrode pattern is in a region between segment electrodes of the metal electrode pattern and is electrically connected to the metal electrode pattern.

According to an example embodiment, the metal electrode pattern includes at least one of titanium (Ti), aluminum (Al), chromium (Cr), gold (Au), and an alloy containing at least one of Ti, Al, Cr and Au.

According to an example embodiment, the metal electrode pattern has at least one gap from about 100 µm to about 500 µm.

According to an example embodiment, the transparent electrode pattern includes at least one of a transparent conducting oxide, carbon nanotube (CNT), and graphene.

According to an example embodiment, the transparent electrode pattern includes at least one of indium-tin oxide (ITO) and zinc oxide (ZnO).

According to an example embodiment, the transparent electrode pattern includes at least one of a transparent conducting oxide, carbon nanotube (CNT), and graphene.

According to an example embodiment, the transparent electrode pattern includes at least one of indium-tin oxide (ITO) and zinc oxide (ZnO).

According to an example embodiment, another one of the first and second electrodes is a reflective electrode layer.

According to an example embodiment, the reflective electrode layer includes at least one of silver (Ag), aluminum (Al), rhodium (Rh), and an alloy containing at least one of Ag, Al and Rh.

According to an example embodiment, the LED further includes an exit pattern layer on an exit portion of the semiconductor layer. The exit layer pattern includes the at least one of the first and second electrodes. The exit pattern layer is configured to pass light generated in the active layer.

According to an example embodiment, the exit pattern layer includes an embossed pattern.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
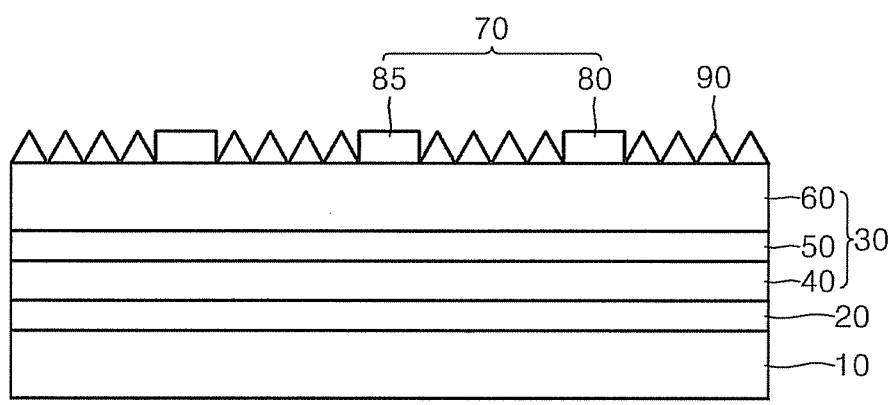
FIG. 1 is a cross-sectional view showing a schematic structure of a vertical light emitting device (LED) according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A vertical light emitting device (LED) such as vertical gallium nitride (GaN)-based LED grown on a sapphire or silicon growth substrate exhibits a poor current spreading effect since a semiconductor layer formed under an upper metal electrode to serve as a current spreading layer has a thin thickness of several micrometers. Non-uniform current spreading results in a concentration of current in local regions, high current density, low internal quantization efficiency, and high driving voltage. Furthermore, it will overheat the local regions where current is concentrated and shorten an LED lifetime, thereby significantly degrading reliability. A high output, large area vertical LED consuming 1 watt or more has a chip size larger than about 1 mm*1 mm. In a vertical GaN-based LED grown on the sapphire or silicon substrate, a semiconductor current spreading layer with a thickness of several micrometers that is disposed between an upper n-type electrode and a lower p-type reflective electrode cannot provide a sufficient current spreading effect. Thus, current spreading poses a major challenge for design of a high power, large area vertical LED chip having a large area and being driven at high current.

In order to achieve smooth current spreading in a high power, large area LED chip, a metal electrode pattern is disposed on a side from which light exits. Since a gap between a metal electrode pattern is about 100 μm and a distance between an upper n-type electrode and a lower p-type reflective electrode in a vertical GaN-based LED is in the order of several micrometers, current will not flow readily between the metal electrode pattern compared to between the upper n-type electrode and the lower p-type reflective electrode, thereby providing low current density. Decreasing the gap between the metal electrode patterns may improve current spreading performance but degrade light extraction efficiency by impeding light extraction.

A vertical LED according to an example embodiment employs a metal electrode pattern to provide smooth current spreading when realizing a high power, large area vertical LED chip. The vertical LED according to the example embodiment further includes a transparent electrode pattern between the metal electrode patterns, thereby providing an improved current spreading effect without compromising light extraction efficiency despite using the dense electrode pattern. For example, the vertical LED according to the example embodiment uses the transparent electrode pattern that may transmit visible light to prevent degradation of light extraction efficiency due to the dense metal electrode pattern. Furthermore, the vertical LED provides an increased contact area between the n-type electrode and lower semiconductor layer, thereby resulting in a reduction in the overall contact resistance.

Figure 2:
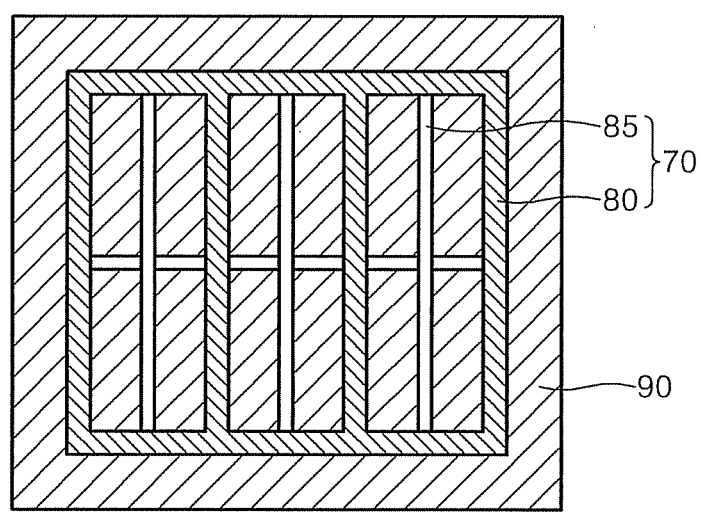
FIG. 2 is a top view of the vertical LED of FIG. 1.

FIG. 1 is a cross-sectional view showing a schematic structure of a vertical LED according to an example embodiment, and FIG. 2 is a top view of the vertical LED of FIG. 1.

Referring to FIGS. 1 and 2, the vertical LED according to the example embodiment includes a semiconductor layer 30 including an active layer 50 emitting light, a first electrode 20 underlying the semiconductor layer 30, and a second electrode 70 overlying the semiconductor layer 30. A layer structure including the first electrode 20, the semiconductor layer 30, and the second electrode 70 is disposed on a support layer 10.

The semiconductor layer 30 includes first and second semiconductor layers 40 and 60 having opposite conductivity types and the active layer 50 interposed between the first and second semiconductor layers 40 and 60.

For example, the first semiconductor layer 40 may be a p-type semiconductor layer such as a p-type GaN-based semiconductor layer. For example, the second semiconductor layer 60 may be an n-type semiconductor layer such as an n-type GaN-based semiconductor layer. However, as will be apparent, the first semiconductor layer 40 may be an n-type semiconductor layer and the second semiconductor layer 60 may be an p-type semiconductor layer. The first semiconductor layer 40, the active layer 50, and the second semiconductor layer 60 may be sequentially stacked on the first electrode 20. When the first and second semiconductor layers 40 and 60 are p-type and n-type, respectively, the first and second electrodes 20 and 70 are p- and n-electrodes, respectively.

The active layer 50 may be a light-emitting layer having an indium gallium nitride (InGaN)/GaN multiple quantum-well (MQW) structure.

The first electrode 20 may be disposed between the support layer 10 and the first semiconductor layer 40 while the second electrode 70 may be disposed on the second semiconductor layer 60. The first electrode 20 may be a reflective electrode that causes light generated in the active layer 50 to exit upward through a side on which the second electrode 70 is formed, not through the support layer 10. The first electrode 20 may be formed of silver (Ag), aluminum (Al), rhodium (Rh), or an alloy containing at least one of these three elements.

In order to achieve smooth current spreading, the second electrode 70 located at the side through which light generated in the active layer 50 exits includes a metal electrode pattern 80 and a transparent electrode pattern 85 disposed between segment electrodes in the metal electrode pattern 80 and electrically connected to the metal electrode pattern 80. The transparent electrode pattern 85 may transmit at least visible light.

The metal electrode pattern 80 may be formed of titanium (Ti), aluminum (Al), chromium (Cr), gold (Au), or an alloy containing at least one of these four elements. A gap between the metal electrode pattern 80 is in the range of about 100 μm to about 500 μm, e.g., about 200 μm to about 300 μm.

For better current spreading, the metal electrode pattern 80 may be a dense electrode pattern with small gaps therein. The metal electrode pattern 80 has a low resistance but may reduce light extraction efficiency by reflecting and absorbing light generated in the active layer 50. That is, as the gap in the metal electrode pattern 80 decreases, the current spreading becomes better while light extraction efficiency decreases. The gap in the metal electrode pattern 80 may be determined appropriately considering light extraction efficiency.

By forming the transparent electrode pattern 85 electrically connected to the metal electrode pattern 80 disposed in an intermediate region between segment electrodes in the metal electrode pattern 80 as another electrode pattern, a gap in the electrode pattern is decreased. This may improve current spreading without sacrificing light extraction efficiency. Furthermore, a contact area between the second electrode 70, i.e., the n-electrode, and the second semiconductor layer 60 may be increased, thereby reducing the overall contact resistance.

The transparent electrode pattern 85 may be formed of a material containing at least one of a transparent conducting oxide, carbon nanotube (CNT), and graphene. The transparent conducting oxide may contain indium-tin oxide (ITO) or zinc oxide (ZnO).

The vertical LED according to the example embodiment further includes an exit pattern layer 90 formed on an exit portion of the second semiconductor layer 60 so as to enhance external light extraction efficiency. That is, the exit pattern layer 90 allows light generated in the active layer 50 to escape easily without being reflected (completely or partially) at the outside boundary. For example, the exit pattern layer 90 may have an embossed pattern that may be formed by performing texturing on surfaces of the second semiconductor layer 60 and a buffer layer (not shown) used to assist the growth of a semiconductor layer.

For example, the exit pattern layer 90 may contain at least one of material layers selected from the group consisting of n-GaN, undoped (u)-GaN, AlGaN, AlN, InGaN, and silicon carbide (SiC). The exit pattern layer 90 may be obtained by dry etching or wet etching the material layer to form an embossed pattern.

The vertical LED according to the example embodiment having the above-described structure may be a GaN-based vertical LED. In this case, the first and second semiconductor layers 40 and 60 may be a p-type GaN-based semiconductor layer and an n-type GaN-based semiconductor layer, respectively. The first and second electrodes 20 and 70 may be p-electrode (p-type reflective electrode) and n-electrode, respectively. The active layer 50 may have an InGaN/GaN MQW structure.

Figure 3:
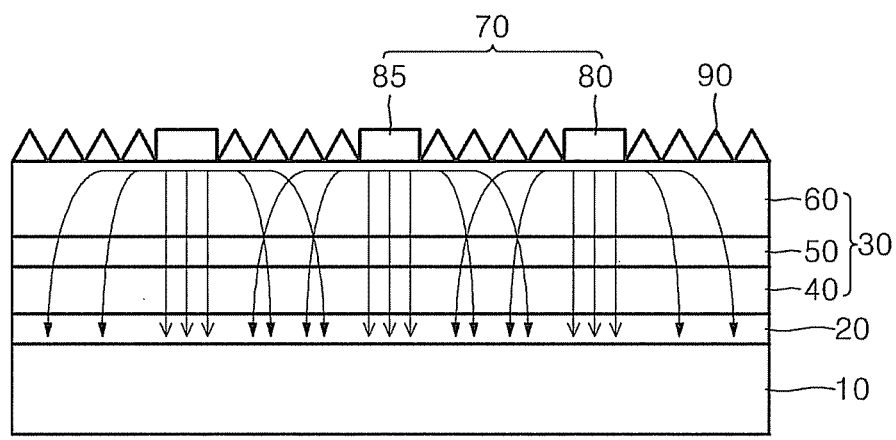
FIG. 3 schematically illustrates a flow of current in the vertical LED of FIG. 1.
Figure 4:
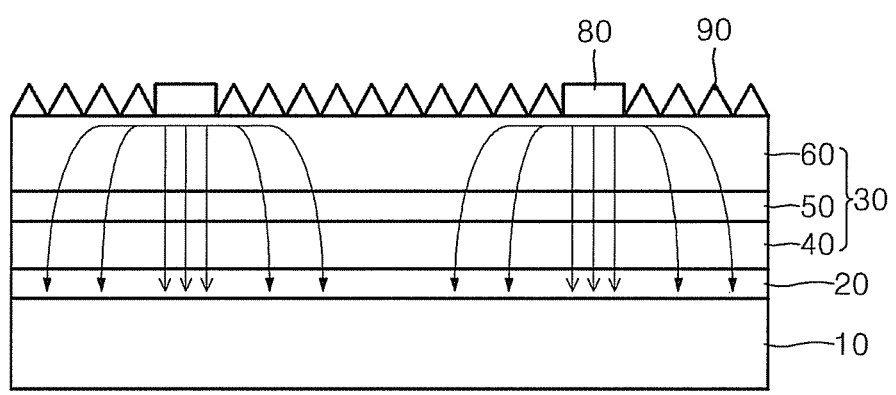
FIG. 4 compares a flow of current in a vertical LED having only a metal electrode pattern without a transparent electrode pattern with the flow of current in the vertical LED of FIG. 3.

FIG. 3 schematically illustrates current flow in the vertical LED of FIG. 1. FIG. 4 compares a flow of current in a vertical LED having only a metal electrode pattern 80 without a transparent electrode pattern 85 with the flow of current in the vertical LED of FIG. 3.

As evident from FIGS. 3 and 4, the vertical LED of FIG. 3 having the metal electrode pattern 80 and the transparent electrode pattern 85 exhibits more uniform current flow than the vertical LED of FIG. 4.

The vertical LED according to the example embodiment may be fabricated by the following process. However, the fabrication process is not limited thereto.

Figure 5A:
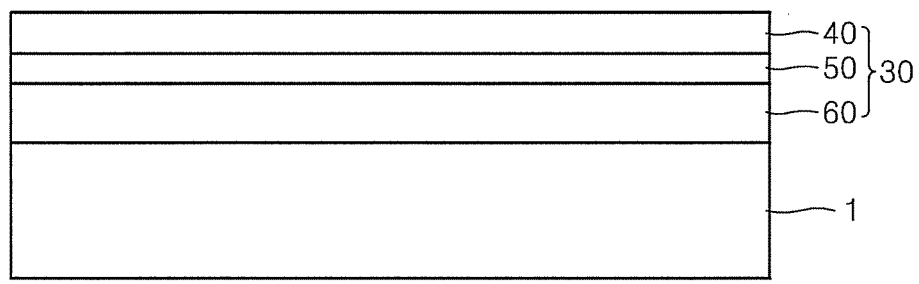
FIGS. 5A through 5E illustrates a method of manufacturing a vertical LED according to an example embodiment.

Referring to FIG. 5A, the multilayered semiconductor layer 30 including the second semiconductor layer 60 such as an n-type GaN-based semiconductor layer, the active layer (light-emitting layer) 50, and the first semiconductor layer 40 such as a p-type GaN-based semiconductor layer is formed on a growth substrate 1 made of sapphire ($Al_2O_3$), Si, or SiC. Although not shown in FIG. 5A, a buffer layer and an u-GaN layer may be further provided between the growth substrate 1 and the second semiconductor layer 60 so as to assist the growth of the semiconductor layers 30 and 60 and obtain a high quality semiconductor layer. The buffer layer may contain at least one of material layers selected from the group consisting of AlN, AlGaN, InGaN, u-GaN, and SiC. For example, the active layer 50 may have a MQW structure including InGaN/GaN.

Figure 5B:
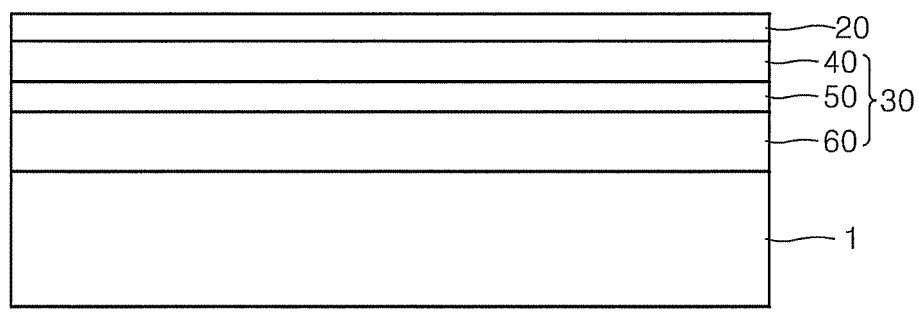
Figure 5C:
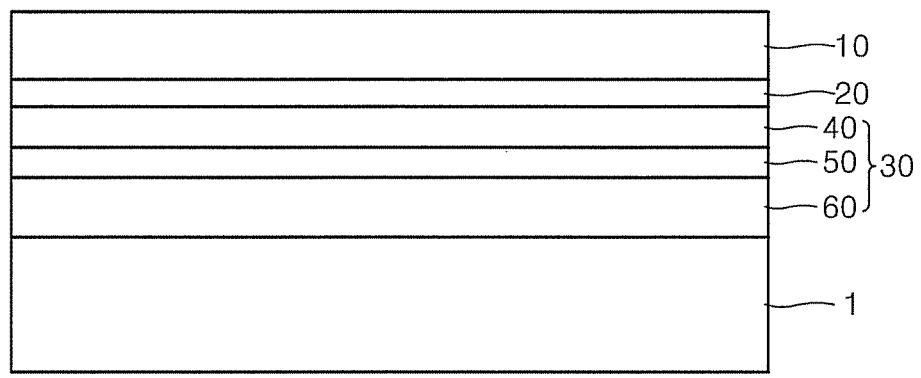

Referring to FIG. 5B, the first electrode 20, such as a p-type reflective electrode, may be formed on the first semiconductor layer 40 such as the p-type GaN-based semiconductor layer. As described above, the first electrode 20 may include Ag, Al, Rh, or an alloy containing at least one of these three elements.

Referring to FIG. SC, the support layer 10 is attached to the first electrode 20 that is the p-type reflective electrode by wafer bonding or plating, followed by separation or removal of the growth substrate 1. For example, the growth substrate 1 may be separated using laser lift off, chemical lift off, dry etching and/or wet etching. When the growth substrate 1 is a SiC substrate, a portion of or the entire substrate may be left intact.

Figure 5D:
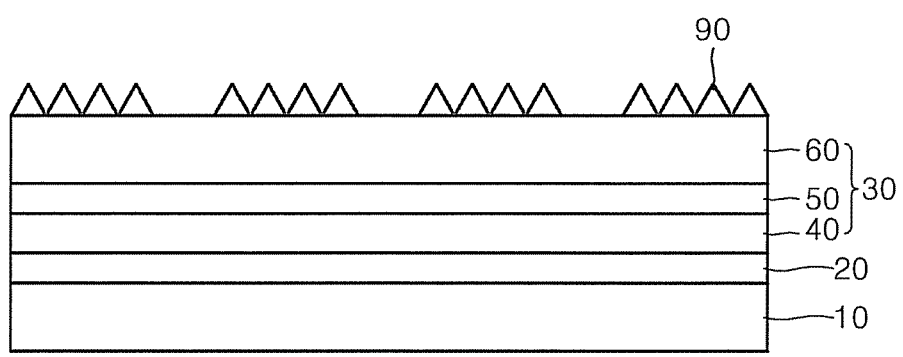

Referring to FIG. 5D, the device having the growth substrate removed is turned upside down, and the exit pattern layer 90 having an embossed pattern is formed on a surface exposed after removal of the growth substrate 1. As described above, the exit pattern layer 90 may include layers that will be used as a buffer layer during growth and a portion of the second semiconductor layer 60. The exit pattern layer 90 may contain at least one of material layers selected from the group consisting of AlN, AlGaN, InGaN, n-GaN, u-GaN, and SiC. The exit pattern layer 90 may be formed by dry and/or wet etching. An embossed pattern may be formed by Photo-Electro-Chemical (PEC) etching mostly using potassium hydroxide (KOH). The embossed pattern may be formed in consideration of a region for formation of the second electrode 70.

Figure 5E:
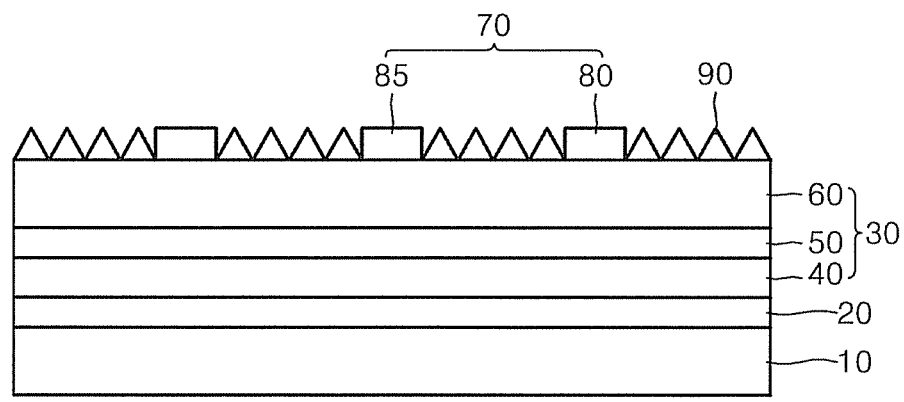

Referring to FIG. 5E, following formation of the exit pattern layer 90 as described above, the buffer layer and u-GaN layer are etched to expose a conducting semiconductor layer at a region for formation of the second electrode 70. The second electrode 70 having a combination of the metal electrode pattern 80 and the transparent electrode pattern 85 is formed on the exposed conducting semiconductor layer, the second semiconductor layer 60.

Figure 6A:
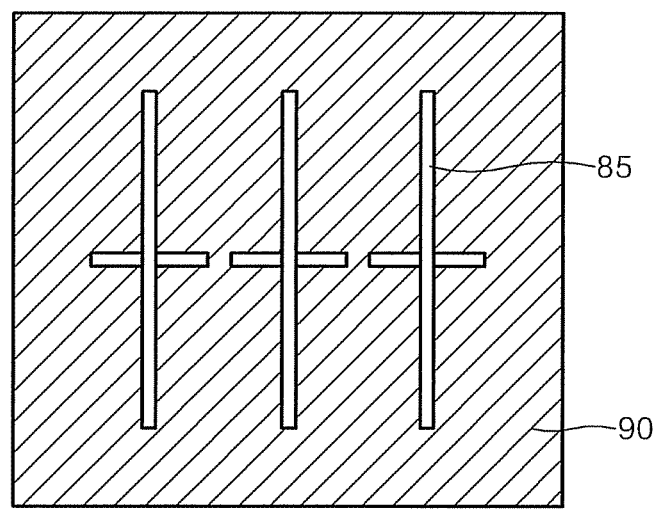
FIG. 6A is a schematic diagram of a transparent electrode pattern overlying an exit pattern layer.
Figure 6B:
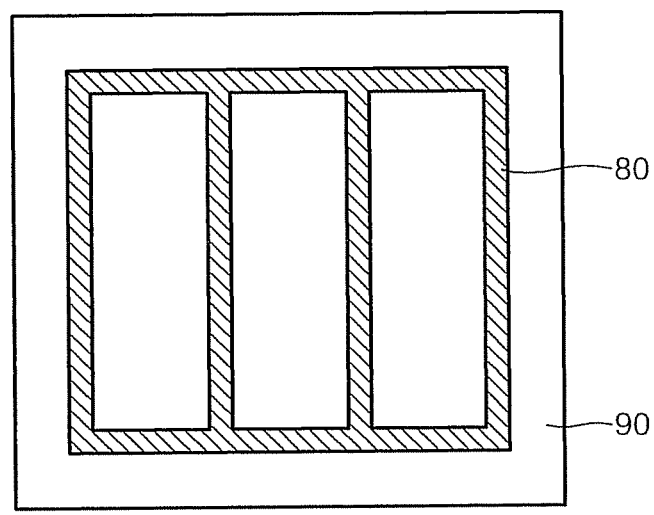
FIG. 6B is a schematic diagram of a metal electrode pattern overlying an exit pattern layer.
Figure 6C:
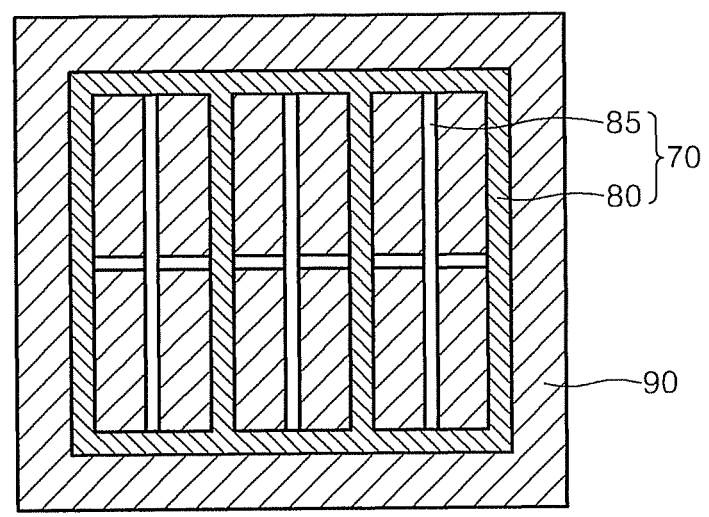
FIG. 6C is a schematic diagram of a second electrode having a combination of the metal electrode pattern of FIG. 6A and the transparent electrode pattern of FIG. 6B.

FIG. 6A illustrates the exit pattern layer 90 and the overlying transparent electrode pattern 85 and FIG. 6B illustrates the exit pattern layer 90 and the overlying metal electrode pattern 80. FIG. 6C illustrates the second electrode 70 having a combination of the metal electrode pattern 80 and the transparent electrode pattern 85 formed to enhance current spreading in the gaps in the metal electrode pattern 80.

Referring to FIG. 6A, the transparent electrode pattern 85 having a shape as shown in FIG. 6A is formed on the conducting semiconductor layer, the second semiconductor layer 60, and exposed for formation of an electrode. And then the metal electrode pattern 80 having a shape as shown in FIG. 6B is formed so as to be electrically connected to the transparent electrode pattern 85 at an intersection of the metal electrode pattern 80 and the transparent electrode pattern 85. Referring to FIG. 6C, an electrode pattern having the metal electrode pattern 80 and the transparent electrode pattern 85 electrically connected at the intersection of the metal electrode pattern 80 and the transparent electrode pattern 85 is then obtained as the second electrode 70. In this case, the metal electrode pattern 80 may be formed prior to formation of the transparent electrode pattern 85 that is electrically connected at the intersection therebetween.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A vertical light emitting device (LED), comprising: a semiconductor layer including an active layer configured to emitting light; a first electrode on a first side of the semiconductor layer; and a second electrode on a second side of the semiconductor layer opposite to the first electrode, at least one of the first and second electrodes including a metal electrode pattern and a transparent electrode pattern, the metal electrode pattern directly contacting the semiconductor layer, the transparent electrode pattern being in a region between segment electrodes of the metal electrode pattern, and being electrically connected to the metal electrode pattern; and an embossed exit pattern configured to pass light generated in the active layer, the embossed exit pattern filling spaces between the metal electrode pattern and the transparent electrode pattern.

2. The LED of claim 1, wherein the metal electrode pattern includes at least one of titanium (Ti), aluminum (Al), chromium (Cr), gold (Au), and an alloy containing at least one of Ti, Al, Cr and Au.

3. The LED of claim 2, wherein the metal electrode pattern has at least one gap from about 100 μm to about 500 μm.

4. The LED of claim 2, wherein the transparent electrode pattern includes at least one of a transparent conducting oxide, carbon nanotube (CNT), and graphene.

5. The LED of claim 4, wherein the transparent electrode pattern includes at least one of indium-tin oxide (ITO) and zinc oxide (ZnO).

6. The LED of claim 1, wherein the transparent electrode pattern includes at least one of a transparent conducting oxide, carbon nanotube (CNT), and graphene.

7. The LED of claim 6, wherein the transparent electrode pattern includes at least one of indium-tin oxide (ITO) and zinc oxide (ZnO).

8. The LED of claim 1, wherein another one of the first and second electrodes is a reflective electrode layer.

9. The LED of claim 8, wherein the reflective electrode layer includes at least one of silver (Ag), aluminum (Al), rhodium (Rh), and an alloy containing at least one of Ag, Al and Rh.

10. The LED of claim 8, further comprising:
an exit pattern layer on an exit portion of the semiconductor layer, the exit pattern layer including the at least one of the first and second electrodes, and the exit pattern layer configured to pass light generated in the active layer.

11. The LED of claim 8, wherein the exit pattern layer includes an embossed pattern.

12. The LED of claim 1, further comprising:
an exit pattern layer on an exit portion of the semiconductor layer, the exit pattern layer including the at least one of the first and second electrodes, and the exit pattern layer configured to pass light generated in the active layer.

13. The LED of claim 12, wherein the exit pattern layer includes an embossed pattern.

14. The LED of claim 1, further comprising:
a supporting layer, wherein one of the first and second electrodes is between the supporting layer and the semiconductor layer.

* * * * *